United States Patent
Hembree et al.

(10) Patent No.: US 6,255,840 B1
(45) Date of Patent: Jul. 3, 2001

(54) SEMICONDUCTOR PACKAGE WITH WIRE BOND PROTECTIVE MEMBER

(75) Inventors: David R. Hembree; Salman Akram; Derek Gochnour, all of Boise; Warren M. Farnworth, Nampa, all of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/304,941

(22) Filed: May 4, 1999

Related U.S. Application Data

(62) Division of application No. 08/845,782, filed on Apr. 25, 1997, now Pat. No. 6,025,728.

(51) Int. Cl.⁷ ............................................... G01R 31/26
(52) U.S. Cl. .................................... 324/765; 324/755
(58) Field of Search .................... 324/755, 765, 324/762, 761; 438/14, 17–18; 257/40, 48

(56) References Cited

U.S. PATENT DOCUMENTS

| | | | |
|---|---|---|---|
| D. 401,567 | 11/1998 | Farnworth et al. | D13/182 |
| 4,969,828 | 11/1990 | Bright et al. | 439/68 |
| 4,992,850 | 2/1991 | Corbett et al. | 357/72 |
| 5,006,792 | 4/1991 | Malhi et al. | 324/158 F |
| 5,073,117 | 12/1991 | Malhi et al. | 439/71 |
| 5,088,190 | 2/1992 | Malhi et al. | 29/843 |
| 5,123,850 | 6/1992 | Elder et al. | 439/67 |
| 5,289,631 | 3/1994 | Koopman et al. | 29/840 |
| 5,302,891 | 4/1994 | Wood et al. | 324/158 F |
| 5,322,446 | 6/1994 | Cearley-Cabbiness | 439/73 |
| 5,367,253 | 11/1994 | Wood et al. | 324/158.1 |
| 5,408,190 | 4/1995 | Wood et al. | 324/765 |
| 5,424,652 | 6/1995 | Hembree et al. | 324/765 |
| 5,440,240 | 8/1995 | Wood et al. | 324/765 |
| 5,451,165 | 9/1995 | Cearley-Cabbiness et al. | 439/71 |
| 5,468,999 | 11/1995 | Lin et al. | 257/784 |
| 5,483,174 | 1/1996 | Hembree et al. | 324/765 |
| 5,483,741 | 1/1996 | Akram et al. | 29/846 |
| 5,495,179 | 2/1996 | Wood et al. | 324/755 |
| 5,517,125 | 5/1996 | Posedel et al. | 324/755 |
| 5,519,332 | 5/1996 | Wood | 324/755 |
| 5,523,697 | 6/1996 | Farnworth et al. | 324/758 |
| 5,530,376 | 6/1996 | Lim et al. | 324/765 |
| 5,539,324 | 7/1996 | Wood et al. | 324/758 |
| 5,541,525 | 7/1996 | Wood et al. | 324/755 |
| 5,543,725 | 8/1996 | Lim et al. | 324/755 |
| 5,581,195 | 12/1996 | Lee et al. | 324/755 |
| 5,691,649 | 11/1997 | Farnworth et al. | 324/755 |
| 5,783,461 | 7/1998 | Hembree | 438/17 |
| 5,815,000 | 9/1998 | Farnworth et al. | 324/755 |

(List continued on next page.)

FOREIGN PATENT DOCUMENTS

| | | |
|---|---|---|
| 3-146884 | 9/1991 | (JP). |
| 5-218153 | 8/1993 | (JP). |

OTHER PUBLICATIONS

*1994 DRAM Data Book*, Micron Semiconductor, Inc., pp. 7-7—7-13, Apr., 1994.

*Primary Examiner*—Vinh Nguyen
(74) *Attorney, Agent, or Firm*—Stephen A. Gratton

(57) ABSTRACT

A package, system and method for testing semiconductor dice are provided. The package include a base for retaining the die, and an interconnect having contact members for establishing temporary electrical connections with the die. Electrical paths are formed between terminal contacts on the base, and the contact members on the interconnect, by wires that are wire bonded to conductors on the base and interconnect. The package includes a protective member for protecting the wires and associated wire bonds during assembly, disassembly and handling of the package. The protective member can be formed as a plate mounted to the base and configured to cover the wires and wire bonds. Alternately the protective member can comprise an encapsulating material such as an epoxy resin or silicone elastomer deposited on the wires and wire bonds and then cured.

25 Claims, 3 Drawing Sheets

U.S. PATENT DOCUMENTS

| | | |
|---|---|---|
| 5,834,945 | 11/1998 | Akram et al. ......................... 324/755 |
| 5,844,418 | 12/1998 | Wood et al. ......................... 324/755 |
| 5,878,485 | 3/1999 | Wood et al. . |
| 5,896,036 | 4/1999 | Wood et al. . |
| 5,929,647 | 7/1999 | Akram et al. . |
| 5,946,553 | 8/1999 | Wood et al. . |
| 5,962,921 | 10/1999 | Farnworth et al. . |
| 6,025,728 | 2/2000 | Hembree et al. . |
| 6,025,731 | 2/2000 | Hembree et al. . |
| 6,060,894 | 5/2000 | Hembree et al. . |
| 6,072,323 | 6/2000 | Hembree et al. . |
| 6,091,251 | 7/2000 | Wood et al. . |
| 6,094,058 | 7/2000 | Hembree et al. . |

SEMICONDUCTOR PACKAGE WITH WIRE BOND PROTECTIVE MEMBER

CROSS REFERENCE TO RELATED APPLICATIONS

This application is a division of patent application Ser. No. 08/845,782 filed Apr. 25, 1997, now U.S. Pat. No. 6,025,728.

FIELD OF THE INVENTION

This invention relates generally to semiconductor manufacture and more particularly to an improved semiconductor package having a protective member for the wires and wire bonds of an interconnect for the package.

BACKGROUND OF THE INVENTION

Temporary packages are used in the testing of bare semiconductor dice. For example, temporary packages can be used in place of conventional plastic or ceramic semiconductor packages for testing bare dice. One type of temporary package is adapted to contain a single bare die, or a chip scale package, for burn-in testing. This type of package can include a base for holding the die, and an interconnect component that mounts to the base. The interconnect provides temporary electrical connections between contacts on the die and terminal contacts (e.g., J-bend pins) formed on the base. The terminal contacts are adapted to electrically connect to a burn-in board, or other testing apparatus, in electrical communication with testing circuitry.

One method for mounting the interconnect to the base involves wire bonding. With this method, the interconnect includes conductors (e.g., traces) in electrical communication with contact members. The contact members on the interconnect are configured to electrically connect to contacts on the die (e.g., test pads, bond pads). The base includes conductors (e.g., internal traces) in electrical communication with the terminal contacts. Wires can be bonded to the conductors on the interconnect and the conductors on the base to form electrical paths therebetween. These wires are herein referred to as "wires", and their bonded connections are referred to as "wire bonds".

In some cases the wires are made relatively long to provide improved electrical characteristics for the package. For example, aluminum alloy wires used for wirebonding, typically have a lower resistance than the thin film conductors formed on the interconnect. Accordingly, it can be advantageous to make the wires as long as possible, and the thin film conductors as short as possible. This allows test procedures to be performed at higher speeds with lower resistance and reduced parasitics.

One problem with the long wires is that they tend to reduce the reliability of the temporary package. In particular, the wires can be bumped during handling and transport of the package causing sagging and shorting. The temporary packages are designed to be assembled and disassembled multiple times and the wires are often exposed. In addition, the wire bonds on the interconnect or base, are also subject to damage during continued usage of the temporary package. It would be advantageous for a temporary package to include some type of protection for the wires of the package and for the associated wire bonds. This would permit the wires to made as long as possible without compromising the performance of the temporary package.

SUMMARY OF THE INVENTION

In accordance with the present invention, an improved semiconductor package, system, and method for testing semiconductor dice are provided. The semiconductor package comprises a base for housing a single bare die; an interconnect for establishing temporary electrical communication with the die; and wires bonded to conductors on the base and interconnect. In addition, the semiconductor package includes a protective member adapted to protect the wires and associated wire bonds.

In an illustrative embodiment, the protective member comprises a plate configured for mating engagement with a mounting shelf on the base. The protective member protects the bonded wires, while at the same time allowing access to the interconnect for assembling the package and removing the tested die. In an alternate embodiment, the protective member comprises an epoxy resin or a silicone based elastomeric material, such as an epoxy resin, dispensed onto the wires and associated wire bonds as a "glob top" and then cured.

The base can include terminal contacts, such as pins or ball contacts, configured for mating electrical engagement with a testing apparatus, such as a burn-in board. In addition, conductors are formed on the base in electrical communication with the terminal contacts. The conductors terminate in bonding pads located on a bonding shelf of the base. Still further, a cover and force applying member are associated with the base to bias the die against the interconnect in the assembled package.

The interconnect includes contact members configured to electrically connect to contacts on the die. In addition, conductors are formed on the interconnect in electrical communication with the contact members, and terminate in bonding pads. Prior to a testing procedure using the package, the wires can be bonded to the bonding pads on the interconnect, and to the bonding pads on the base, to form electrical paths therebetween. During a package assembly procedure, the die can be aligned with the interconnect, and the cover and force applying member secured to the base. The assembled package can then be used to test the die. During a disassembly procedure, the tested die can be removed from the package. The protective member, in addition to protecting the wires and wire bonds during assembly and disassembly of the package, also provides protection during transport, storage and handling of the package.

A system constructed in accordance with the invention includes the assembled semiconductor package, and a testing apparatus such as a burn-in board. The testing apparatus is in electrical communication with testing circuitry adapted to apply test signals to the integrated circuits on the die. During the testing procedure, test signals can be applied through the terminal contacts and conductors on the package base, through the wires, through the conductors and the contact members on the interconnect, and to the contacts on the die.

DETAILED DESCRIPTION OF THE PREFERRED EMBODIMENTS

Figure 1:
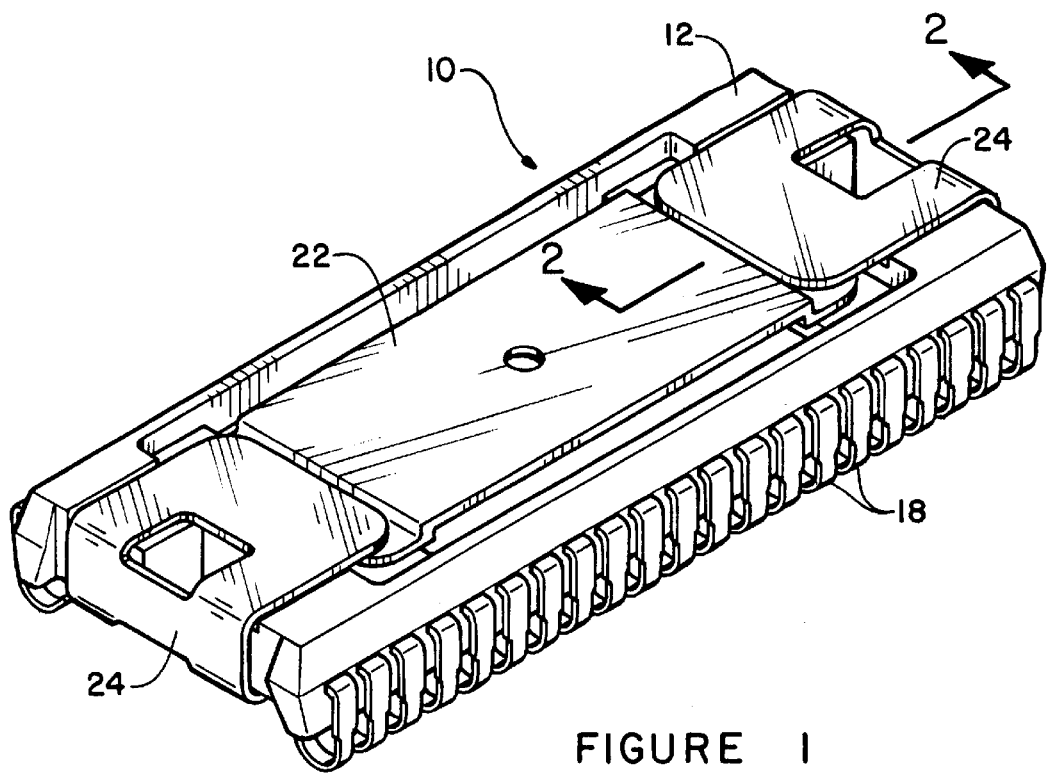
FIG. 1 is an enlarged perspective view of an assembled semiconductor package constructed in accordance with the invention.
Figure 2:
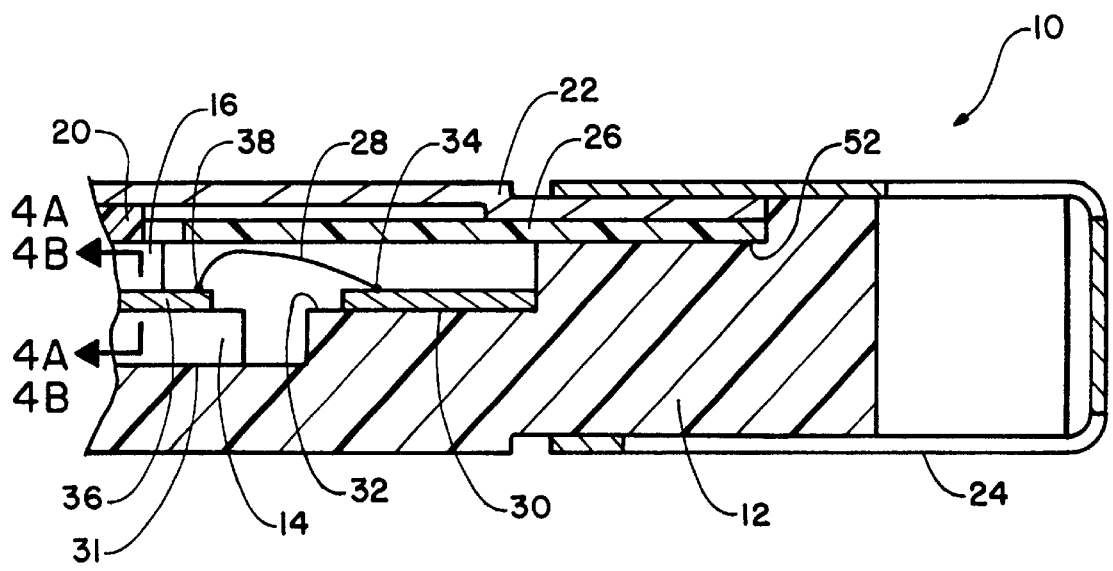
FIG. 2 is an enlarged cross sectional view taken along section line 2—2 of FIG. 1.

Referring to FIGS. 1 and 2, a semiconductor package 10 constructed in accordance with the invention is shown. The package 10 is adapted to contain a single, bare, semiconductor die 16 (FIG. 2) for testing. The package 10 includes a base 12 with terminal contacts 18 (FIG. 1) formed thereon, and an interconnect 14 (FIG. 2) adapted to establish temporary electrical communication with the die 16. The base 12 includes a recessed surface 31 (FIG. 2) wherein the interconnect 14 is mounted.

Wires 28 (FIG. 2) are wire bonded to the interconnect 14 and to the base 12 to establish conductive paths therebetween. In addition, the package 10 includes a protective member 26 (FIG. 2). The protective member 26 removably attaches to the base 12. The protective member 26 is configured to protect the wires 28, while at the same time allowing access to the interconnect 14 for inserting or removing the die 16.

The package 10 also includes a force applying member 20 (FIG. 2) configured to bias the die 16 against the interconnect 14. The force applying member 20 can be formed of a compressible elastomeric material, such as silicone, or as a compressible spring member, such as a belleville washer.

In addition, the package 10 includes a cover 22 and clips 24 that removably attach to the base 12. The clips 24 secure the cover 22 and force applying member 20 to the base 12. The ends of the base 12 are formed in a cross sectional configuration adapted to receive and retain the clips 24. The construction and function of the different components of the package 10 will become more apparent as the description proceeds.

The base 12 can be formed of an electrically insulating material, such as molded plastic, or ceramic. In the illustrative embodiment, the base 12 and terminal contacts 18 thereon, are formed in the configuration of a conventional small outline J-bend (SOJ) package. Alternately, the base 12 and terminal contacts 18 can be formed the configuration of other conventional semiconductor packages, such as ball grid array (BGA), pin grid array (PGA), land grid array (LGA), dual in line package (DIP), zig zag in line package (ZIP), leadless chip carrier (LCC), small outline package (SOP), thin small outline package (TSOP), or quad flat package (QFP).

The base 12 includes patterns of conductors 30 (FIG. 2) in electrical communication with the terminal contacts 18. The patterns of conductors 30 can be formed integrally with the base 12 using a process such as injection molding or lamination. Suitable materials for forming the conductors 30 include tungsten, copper and nickel. Suitable methods for forming the package base 12 are disclosed in U.S. Pat. No. 5,519,332, incorporated herein by reference.

As shown in FIG. 2, the conductors 30 include wire bonds 34 formed on their terminal ends to the wires 28. To facilitate the wire bonding process, the terminal ends of the conductors 30 can be formed with bonding sites or with separate bonding pads having a metallurgy suitable for wire bonding (e.g., gold with nickel underplating). In addition, the base 12 includes a bonding shelf 32 wherein the wire bonds 34 can be formed. The wires 28 can be bonded to the conductors 30 using a wire bonding process such as thermocompression bonding, ultrasonic bonding, or thermosonic bonding. Suitable wirebonders are commercially available from Kulicke and Soffa of Horsham, Pa. and other manufacturers.

Figure 3:
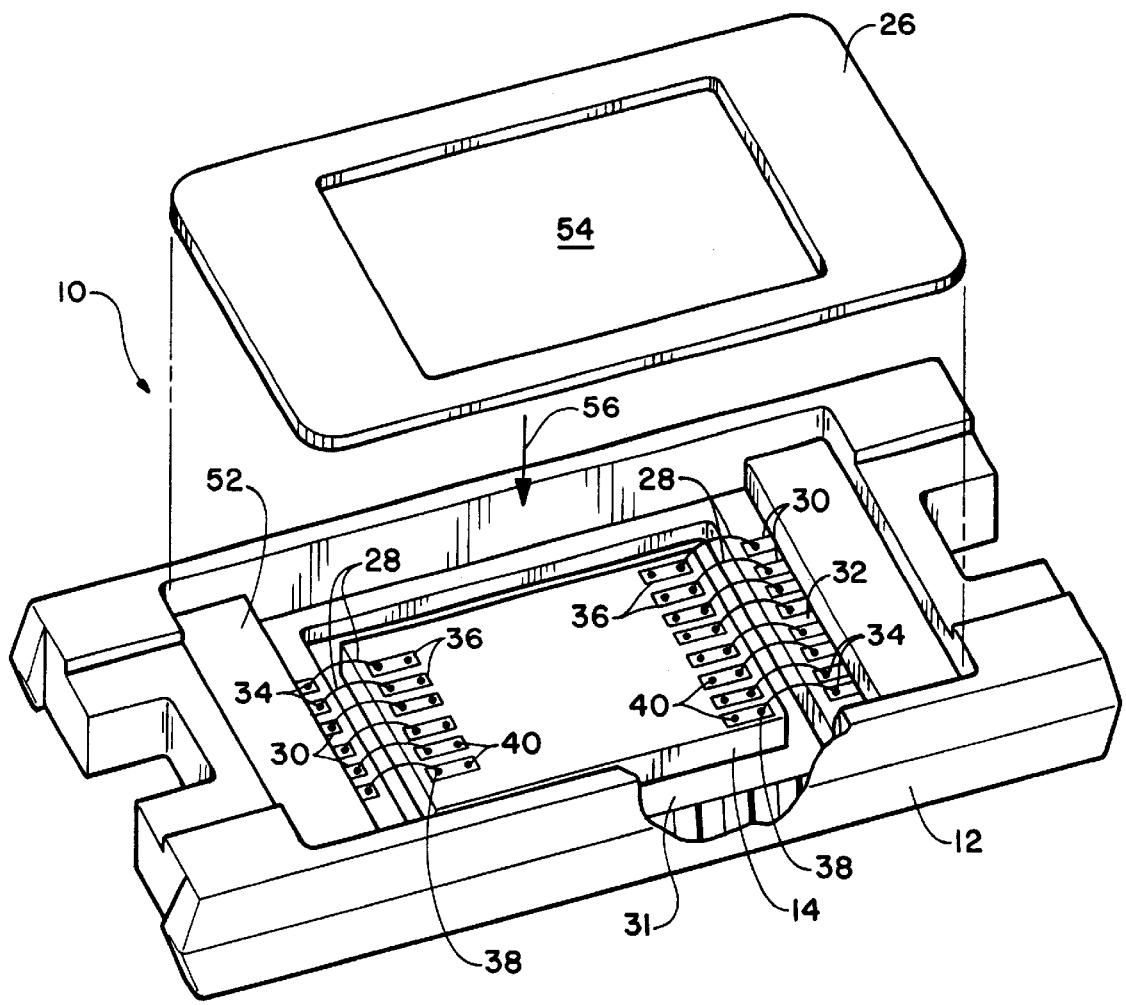
FIG. 3 is an enlarged perspective view, with parts removed, illustrating the assembly of a protective member of the semiconductor package.

Referring to FIG. 3, the interconnect 14 also includes patterns of conductors 36 having wire bonds 38 with the wires 28. The wire bonds 38 can be formed during the above wire bonding process. The conductors 36 can include bonding sites or separate bonding pads having a metallurgy suitable for wire bonding. In addition, the conductors 36 on the interconnect 14 are in electrical communication with the contact members 40.

Figure 4A:
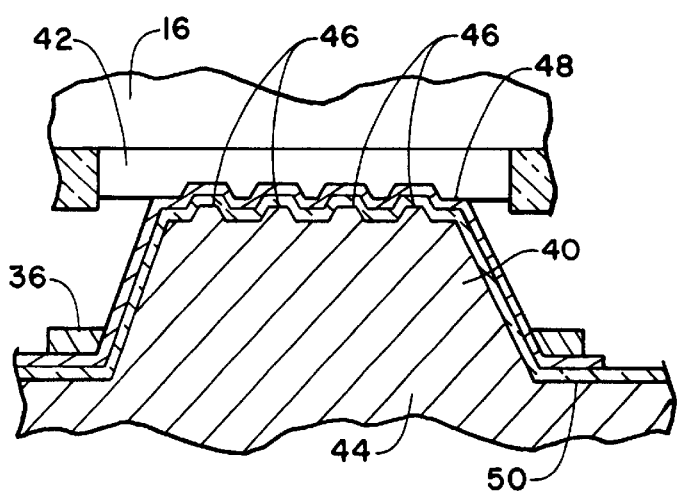
FIG. 4A is an enlarged cross sectional view taken along section line 4A—4A of FIG. 2 illustrating a contact member for the semiconductor package.

Referring to FIG. 4A, the contact members 40 are adapted to electrically connect to contacts 42 on the die 16. The contacts 42 will typically be thin film bond pads, test pads or fuse pads on the die 16. The contact members 40 are formed integrally on a substrate 44 of the interconnect 14. The contact members 40 include penetrating projections 46 adapted to penetrate the contacts 42 on the die 16 to a limited penetration depth. In addition, the contact members 40 include conductive layers 48 in electrical communication with the conductors 36, and an insulating layer 50 formed on the substrate 44. Further details of the interconnect 14, including methods of fabrication, are disclosed in U.S. Pat. No. 5,483,741, incorporated herein by reference.

Figure 4B:
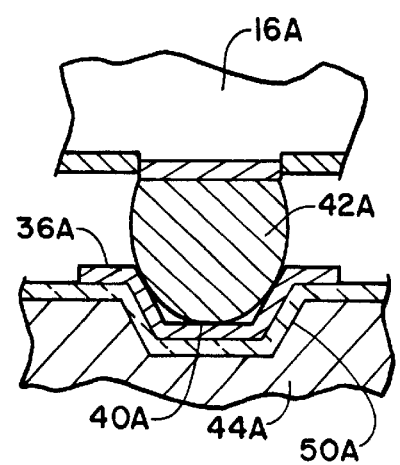
FIG. 4B is an enlarged cross sectional view taken along section line 4B—4B of FIG. 2 illustrating an alternate embodiment contact member.

Referring to FIG. 4B, an alternate embodiment contact member 40A is adapted to form temporary electrical connections with bumped contacts 42A for a bumped die 16A. The contact members 40A are formed on a substrate 44A. The substrate 44A can be formed of silicon, ceramic, or other suitable materials and can include an insulating layer 50A. The contact members 40A include depressions formed in the substrate 44A, sized to retain the bumped contacts 42A. The depressions are covered with conductors 36A, or another metal layer, in electrical communication with the conductors 36A. The conductors 36A function substantially the same as the conductors 36 (FIG. 3) previously described.

Referring again to FIG. 3, the base 12 also includes a mounting shelf 52 wherein the protective member 26 can be retained or removed, as required. The protective member 26 and mounting shelf 52 have mating outer peripheral configurations. As indicated by arrow 56 (FIG. 3), the protective member 26 can be placed onto the mounting shelf 52 and retained by the mating peripheral shapes. If desired, an adhesive (not shown) can be used to further secure the protective member 26 to the mounting shelf 52. The protective member 26 is preferably formed of an electrically insulating material such as plastic.

In the illustrative embodiment, the protective member 26 is a flat, generally rectangular shaped plate that resembles a window frame sized to frame the interconnect 14. The protective member 26 includes an opening 54 that aligns with the interconnect 14. The opening 54 is larger than the die 16 but is smaller than the interconnect 14. The opening 54 permits access for the die 16 (FIG. 4A) to the contact members 40 (FIG. 4A) on the interconnect 14. In addition the opening 54 permits the tested die 16 to be removed from the package 10 while the wires 28 and associated wire bonds 34, 38 remain protected.

As shown in FIG. 2, the protective member 26 has a solid portion that covers the conductors 30 and associated wire bonds 34. The protective member 26 also extends over the wires 28, and over the associated wire bonds 38. Preferably, the mounting shelf 52 for the protective member 26 is dimensioned such that a gap is present between the wires 28 and the protective member 26.

With the protective member 26 in place, the wires 28 are at least partially enclosed by the protective member 26 and by the mounting surface 31 and bonding shelf 30 on the base 12. The protective member 26 thus functions to protect the wires 28 and associated wire bonds 34, 38. Advantageously, the protective member 26 protects the wires 28 and wire bonds 34, 38 during assembly and disassembly of the package 10. The protective member 26 also protects the wires 28 and wire bonds 34, 38 during handling and storage of the package 10. For example, the package 10 can sometimes be transported or stored without the cover 22. In this case, the interconnect 14 and wires 28 would otherwise be exposed, but remain protected by the protective member 26.

As will be further explained, during an assembly procedure, the die 16 is aligned with the interconnect 14 using an optical alignment process. The die 16 is then placed in contact with the interconnect 14, and the cover 22, force applying member 20, and clips 24 are secured to the base 12. The assembled package 10 can then be used for testing the die 16. During a disassembly procedure the clips 24, force applying member 20, cover 22 and tested die 16 are separated from the base 12.

Figure 5:
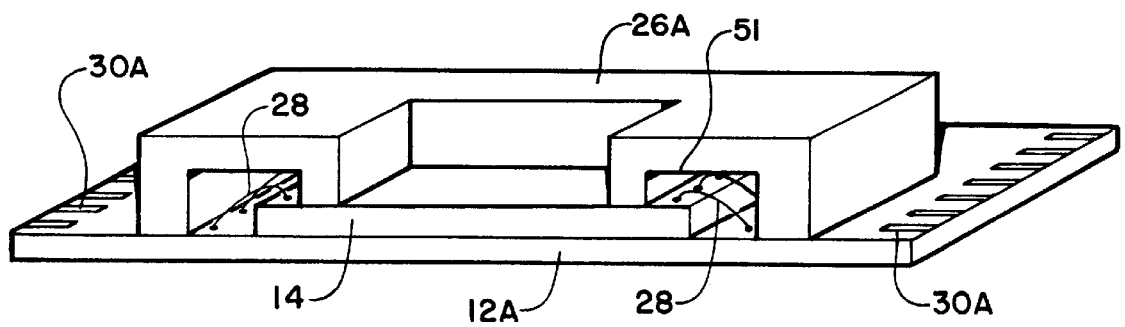
FIG. 5 is an enlarged perspective view illustrating an alternate embodiment protective member.

Referring to FIG. 5, an alternate embodiment protective member 26A is shown. The protective member 26A mounts to a base 12A formed substantially as previously described, and functions substantially similar to the protective member 26 previously described. The protective member 26A is configured to rest directly on the interconnect 14 and a surface of the base 12A. If desired, a mounting shelf can be provided on the base 12A for the protective member 26A. The protective member 26A includes a cup shaped portion 51 configured to enclose the wires 28 and associated wires bonds 34, 38. The cup shaped portion 51 can comprise a molded groove or channel dimensioned to enclose the wires 28. The protective member 26A can be formed as a one piece member as shown, or can be formed in two or more separate segments.

Alternate Embodiment (Encapsulant)

Figure 6:
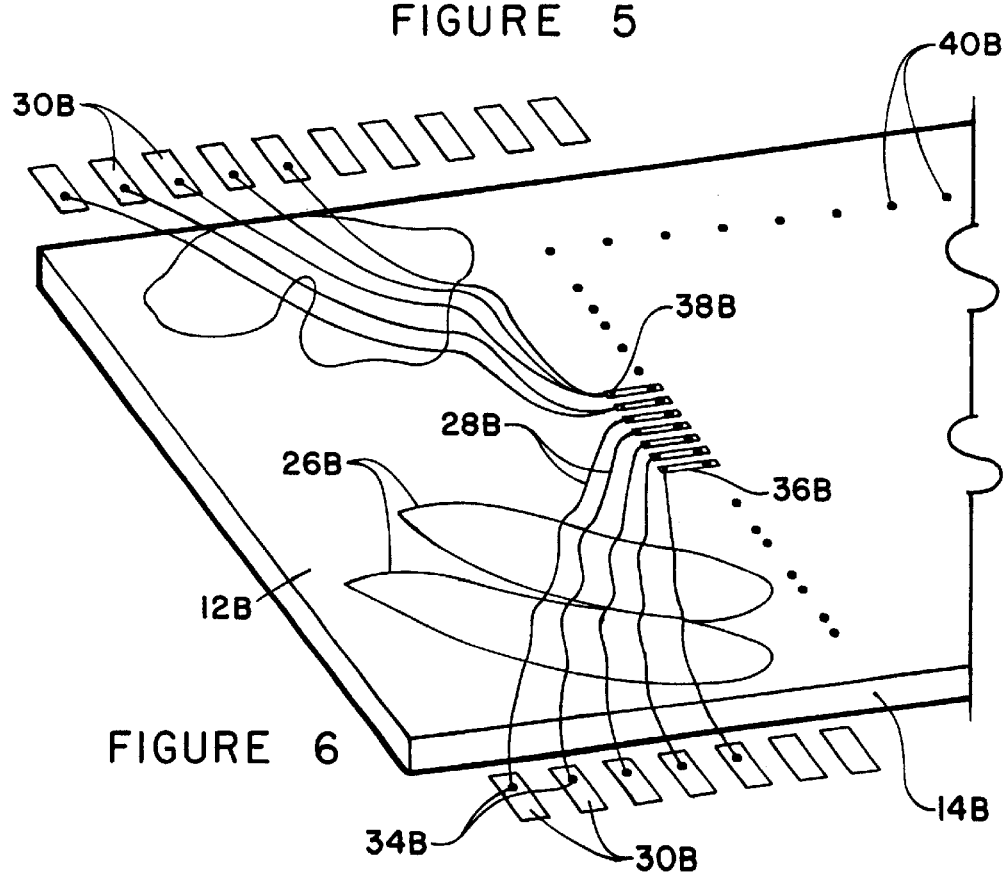
FIG. 6 is an enlarged perspective view illustrating another alternate embodiment protective member.

Referring to FIG. 6, another alternate embodiment protective member 26B is shown. In FIG. 6, an interconnect 14B includes contact members 40B and conductors 36B formed substantially as previously described. In addition, conductors 30B are formed on a package base 12B, substantially as previously described. In this embodiment, the wires 28B are relatively long wires that are bonded to the conductors 30B using wire bonds 34B. In addition, the wires 28B are bonded to the conductors 36B on the interconnect 14B using wire bonds 38B substantially as previously described. The length of the wires 28B permits the conductors 36B on the interconnect 14B to be shorter in length. Since these conductors 36B are thin film metal the wires 28B have less resistance.

The protective member 26B comprises an encapsulating material formed on the interconnect 14B after the wires 28B have been bonded to the interconnect 14B and base 12B. The encapsulating material encapsulates at least a portion of the wires 28B to stabilize and protect the wires 28B. Preferably, the encapsulating material comprises an electrically insulating material deposited on the wires 28B as a viscous paste and then cured. In the illustrative embodiment, the protective member 26B comprise ridges of material oriented approximately perpendicular to the orientation of the wires 28B. One suitable encapsulating material is an epoxy resin used for "glob top" encapsulation of semiconductor chips. This encapsulating material can be dispensed from a syringe or nozzle in a desired pattern on the wires 28B and wire bonds 34B, 38B and then cured as required.

Another suitable encapsulating material comprises a silicone based elastomer. One advantage of a silicone elastomer is that the protective member 26B is flexible and therefore substantially "stress free" as deposited on the interconnect 14B and wires 28B.

System

Figure 7:
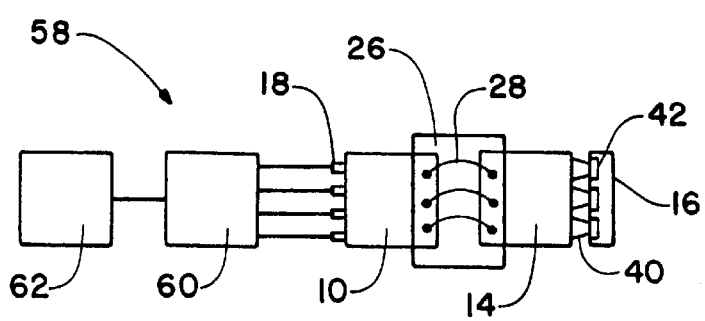
FIG. 7 is a block diagram of a system that includes a semiconductor package constructed in accordance with the invention.

Referring to FIG. 7, a system 58 constructed in accordance with the invention is shown. The system 58 includes the assembled semiconductor package 10 with the die 16 and interconnect 14 mounted therein, as previously described. The system 58 also includes a testing apparatus 60. The testing apparatus 60 can be a conventional burn-in board in electrical communication with testing circuitry 62. The testing circuitry 62 is adapted to apply test signals to the die 16, to test the integrated circuits formed thereon.

In the assembled package 10, the wires 28 form electrical paths between the terminal contacts 18 on the package 10, and the contact members 40 on the interconnect 14. The protective member 26 protects the wires 28 during assembly and disassembly of the package 10. The protective member 26 also protects the wires 28 in the unassembled package 10.

Testing Method

Referring to FIG. 7, a representative test sequence for the test system 58 is as follows. Initially the semiconductor package 10 and testing apparatus 60 can be provided. In addition, the interconnect 14 can be mounted to the package base 12 and wire bonded as previously described. For assembling the package 10 with the die 16 therein, the contacts 42 on the die 16 can be aligned with the contact members 40 on the interconnect 14. This can be accomplished using an optical alignment apparatus as described in the previously cited U.S. Pat. No. 5,519,332. The aligned die 16 and interconnect 14 can then be placed in contact and the force applying member 20 (FIG. 2), cover 22 (FIG. 2), and clips 24 (FIG. 2) attached to the base 12 (FIG. 2) of the package 10.

The assembled package 10 can then be mounted to the testing apparatus 60. With the package 10 mounted to the testing apparatus 60, the terminal contacts 18 on the package 10 and the wires 28 establish an electrical connection to the contact members 40 on the interconnect 14. Using this electrical path, test signals can be applied by the testing circuitry 62 to the integrated circuits contained on the die 16.

Thus the invention provides an improved semiconductor package, system and method for testing semiconductor dice. The package include an interconnect for establishing temporary electrical communication with the dice. In addition, wires and wire bonds form electrical paths between the contact members and terminal contacts on the package base. Still further, the wire and associated wire bonds are protected by a protective member operably associated with the interconnect and package base.

While the invention has been described with reference to certain preferred embodiments, as will be apparent to those skilled in the art, certain changes and modifications can be made without departing from the scope of the invention as defined by the following claims.

What is claimed is:

1. A package for testing a semiconductor die comprising:
   a base configured to retain the die comprising a plurality of first conductors;
   an interconnect on the base configured to establish temporary electrical communication with the die comprising a plurality of second conductors;
   a plurality of wires bonded to the first conductors and to the second conductors;
   a cover and a force applying member on the base configured to bias the die and the interconnect together; and
   an electrically insulating encapsulating material on the interconnect configured to encapsulate and protect at least a portion of the wires.

2. The package of claim 1 wherein the encapsulating material comprises a glob top.

3. The package of claim 1 wherein the encapsulating material comprises a silicone based elastomer or an edoxy resin.

4. The package of claim 1 wherein the encapsulating material encapsulates a plurality of wire bonds on the interconnect associated with the wires.

5. A system for testing a semiconductor die comprising:
   a package for the die comprising a base for retaining the die, an interconnect for establishing temporary electrical communication with the die, and a plurality of wires bonded to the interconnect and to the base;
   a cover and a force applying member on the base configured to bias the die and the interconnect together; and
   an electrically insulating encapsulating material on the interconnect configured to encapsulate and protect at least a portion of the wires.

6. The system of claim 5 wherein the encapsulating material comprises a material selected from the group consisting of epoxy and silicone.

7. A method for testing a semiconductor die comprising:
   providing a temporary package for the die comprising a base and a plurality of first conductors on the base;
   providing an interconnect for establishing temporary electrical communication with the die comprising a plurality of second conductors;
   bonding wires to the first conductors and to the second conductors to provide conductive paths therebetween;
   depositing an encapsulating material on at least a portion of the wires;
   providing a cover and a force applying member on the base configured to bias the die and the interconnect together;
   placing the die on the interconnect with the encapsulating material protecting the wires; and
   applying test signals to the die.

8. The method of claim 7 wherein the encapsulating material comprises a material selected from the group consisting of epoxy and silicone.

9. The method of claim 7 wherein the encapsulating material comprises a cured material.

10. The method of claim 7 wherein the encapsulating material comprises a cured material applied to wire bonds associated with the wires.

11. A package for testing a semiconductor die having a plurality of contacts comprising:
    a base comprising a plurality of first conductors;
    an interconnect on the base comprising a plurality of contact members configured to electrically engage the contacts on the die, and a plurality of second conductors in electrical communication with the contact members;
    a plurality of wires bonded to the first conductors and to the second conductors;
    a cover and a force applying member on the base configured to bias the die and the interconnect together; and
    an encapsulating material on the interconnect configured to encapsulate at least a portion of the wires and to protect the wires during assembly of the package.

12. The package of claim 11 wherein the encapsulating material comprises epoxy or silicone.

13. The package of claim 11 wherein the encapsulating material comprises a cured elastomer deposited on the interconnect as a plurality of ridges.

14. The package of claim 11 wherein the first conductors comprise bond pads bonded to the wires and the encapsulating material covers the bond pads.

15. A package for testing a semiconductor die having a plurality of contacts comprising:
    a base comprising a plurality of first conductors comprising a plurality of first bond pads;
    an interconnect on the base comprising a plurality of contact members configured to electrically engage the contacts on the die, and a plurality of second conductors in electrical communication with the contact members comprising a plurality of second bond pads;
    a plurality of wires bonded to the first bond pads and to the second bond pads;
    a cover and a force applying member on the base configured to bias the die and the interconnect together; and
    an encapsulating material on the interconnect configured to protect the wires.

16. The package of claim 15 wherein the encapsulating material comprises a glob top.

17. The package of claim 15 wherein the encapsulating material comprises ridges oriented substantially perpendicular to an orientation of the wires.

18. The package of claim 15 wherein the encapsulating material comprises silicone or epoxy ridges.

19. The package of claim 15 wherein the contact members comprise penetrating projections configured to penetrate the contacts on the die.

20. The package of claim 15 wherein the contact members comprise depressions configured to retain the contacts on the die.

21. The package of claim 15 wherein the first bond pads are at least partially covered by the encapsulating material.

22. The package of claim 15 wherein the encapsulating material covers at least a portion of the base.

23. A package for testing a semiconductor die comprising:
    a base comprising a plurality of first conductors;
    an interconnect on the base comprising a plurality of contact members configured to electrically engage contacts on the die, and a plurality of second conductors in electrical communication with the contact members;

a plurality of wires bonded to the first conductors and to the second conductors;

a cover and a force applying member on the base configured to bias the die and the interconnect together; and a plurality of cured elastomeric ridges on the interconnect configured to at least partially encapsulate the wires.

24. The package of claim 23 wherein the ridges are oriented substantially perpendicular to an orientation of the wires.

25. The package of claim 23 wherein the cured elastomeric ridges comprise epoxy or silicone.

* * * * *

UNITED STATES PATENT AND TRADEMARK OFFICE
CERTIFICATE OF CORRECTION

PATENT NO.     : 6,255,840 B1
DATED          : July 3, 2001
INVENTOR(S)    : David R. Hembree, Salman Akram, Derek Gochnour, Warren M. Farnworth It is certified that error appears in the above-identified patent and that said Letters Patent is hereby corrected as shown below:

<u>Column 7, claim 3,</u>
Line 23, change "edoxy" to -- epoxy --.

Signed and Sealed this

Twenty-second Day of January, 2002

Attest:

JAMES E. ROGAN
*Director of the United States Patent and Trademark Office*

*Attesting Officer*